(12) United States Patent
Bhat et al.

(10) Patent No.: US 8,358,673 B2
(45) Date of Patent: Jan. 22, 2013

(54) STRAIN BALANCED LASER DIODE

(75) Inventors: Rajaram Bhat, Painted Post, NY (US); Dmitry S. Sizov, Corning, NY (US); Chung-En Zah, Holmdel, NJ (US)

(73) Assignee: Corning Incorporated, Corning, NY (US)

( * ) Notice: Subject to any disclaimer, the term of this patent is extended or adjusted under 35 U.S.C. 154(b) by 175 days.

(21) Appl. No.: 13/029,723

(22) Filed: Feb. 17, 2011

(65) Prior Publication Data
US 2012/0213240 A1 Aug. 23, 2012

(51) Int. Cl.
*H01S 5/00* (2006.01)

(52) U.S. Cl. ............. 372/45.01; 372/43.01; 372/45.011; 372/45.012

(58) Field of Classification Search ... 372/43.01–45.012
See application file for complete search history.

(56) References Cited

U.S. PATENT DOCUMENTS

| | | | |
|---|---|---|---|
| 6,631,149 B1 | 10/2003 | Tezen et al. | 372/43 |
| 7,893,424 B2* | 2/2011 | Eichler et al. | 257/13 |
| 7,965,752 B1* | 6/2011 | Bhat et al. | 372/45.012 |
| 8,050,304 B2* | 11/2011 | Denbaars et al. | 372/45.011 |
| 2007/0064757 A1* | 3/2007 | Kim et al. | 372/43.01 |
| 2008/0095492 A1 | 4/2008 | Son et al. | |
| 2010/0107435 A1 | 5/2010 | George et al. | |
| 2010/0150193 A1 | 6/2010 | Bhat et al. | |
| 2011/0013657 A1 | 1/2011 | Sumitomo et al. | 372/45.01 |
| 2012/0097919 A1* | 4/2012 | Speck et al. | 257/13 |

FOREIGN PATENT DOCUMENTS

WO 2010051537 A1 5/2010 ............ 27/15

OTHER PUBLICATIONS

Queren et al., "500 nm electrically driven InGaN ased laser diodes" Applied Physics Letters, 94, 081119, Feb. 2009.
Miyoshi et al., "510-515 nm InGaN-Based Green Laser Diodes on c-Plane GaN Substrate", Applied Physics Express 2, 062201, Apr. 27, 2009.
Enya et al., "531 nm Green Lasing of InGaN Based Laser Diodes on Semi-Polar {2021} Free-Standing GaN Substrates", Applied Physics Express 2, 082101, Jun. 25, 2009.
Tyagi et al., "AlGaN-Cladding Free Green Simipolar GaN Based Laser Diode with a Lasing Wavelength of 506.4 nm", Applied Physics Express 3, 011002, Dec. 6, 2009.
Piprek et al., "Analysis of Wavelength-Dependent Performance Variations of GaN-Based Ultraviolet Lasers", Proc. of SPIE vol. 6766 67660H (2007).
Yoshizumi et al., "Continuous-Wave Operation of 520 nm Green InGaN-Based Laser Diodes on Semi-Polar {2021} GaN Substrates", Applied Physics Express 2, 092101, Jul. 23, 2009.
Lin et al., "High Quality InGaN/AlGaN Multiple Quantum Wells for Semipolar InGaN Green Laser Diodes", Applied Physics Express 3, 082001, Jun. 24, 2010.

(Continued)

*Primary Examiner* — Jessica Stultz
*Assistant Examiner* — Phillip Nguyen
(74) *Attorney, Agent, or Firm* — Bruce P. Watson; Dinsmore & Shohl LLP

(57) ABSTRACT

According to the concepts of the present disclosure, laser diode waveguide configurations are contemplated where the use of Al in the waveguide layers of the laser is presented in the form of InGaN/Al(In)GaN waveguiding superstructure comprising optical confining wells (InGaN) and strain compensating barriers (Al(In)GaN). The composition of the optical confining wells is chosen such that they provide strong optical confinement, even in the presence of the Al(In)GaN strain compensating barriers, but do not absorb lasing emission. The composition of the strain compensating barriers is chosen such that the Al(In)GaN exhibits tensile strain that compensates for the compressive strain of InGaN optical confinement wells but does not hinder the optical confinement.

23 Claims, 1 Drawing Sheet

OTHER PUBLICATIONS

Chen et al., "Numerical study of optical properties of InGaN multi-quantum-well laser diodes with polarization-matched AlInGaN barrier layers", Applied Physics B 95: 145-153, Sep. 30, 2008.

Sizov et al., "Optical gain and gain saturation of blue-green InGaN quantum wells", Phys. Status Solidi A 207, No. 6, 1309-1312, May 28, 2010.

Lutgen et al., "True green InGaN laser diodes", Phys. Status Solidi A 207, No. 6, 1318-1322, May 17, 2010.

Huang et at., "Optical waveguide simulations for the optimization of InGaN-based green laser diodes", Journal of Applied Physics, vol. 107, 023101.

Masaki Ueno et al: "InGaN-based true green laser diodes on novel semi-polarGaN substrates" Journal of Crystal Growth, vol. 315 No. 1, Jul. 15, 2010, pp. 258-262.

Kisin Mikhail et al: "Optimum quantum well width for III-nitride non polar and semipolar laser diodes", Applied Physics Letters, AIP, American Institute of Physics, Melville, NY, US, vol. 94, No. 2, Jan. 13, 2009, pp. 2 1108-1 to 21108-3.

Rodrigues S C P et al: "Optical and electronic properties of AlInGaN/InGaN superlattices" Microelectronics Journal, MacKintosh Publications Ltd. Luton, GB, vol. 36 No. 3-6 Mar. 1, 2005 pp. 434-437.

* cited by examiner

STRAIN BALANCED LASER DIODE

BACKGROUND

1. Field of the Invention

The present disclosure relates to semiconductor lasers and, more particularly, to an optical waveguide structure that is resistant to misfit defect formation and achieves relatively high optical confinement in the active region of the waveguide structure. Semiconductor lasers according to the present disclosure are particularly well suited, for example, as electrically pumped green laser diodes.

2. Technical Background

The present inventors have recognized the advantage of using semipolar substrates in the design and fabrication of electrically pumped green laser diodes based on group-III nitride compounds because of potentially higher optical gain and uniformity, particularly in the case of active regions made of InGaN quantum wells. The present inventors have also recognized that misfit defect formation is a particularly acute problem in the context of laser diode structures grown on semipolar substrates because, during the growth of AlGaN or InGaN layers, strong tensile and compressive strain accumulate and lead to the formation of misfit dislocations upon strain relaxation. These misfit dislocations can lead to poor emission efficiency and reliability.

The present inventors have recognized that the presence of Al in the waveguide layer of a laser diode is generally considered to be undesirable because AlGaN and AlInGaN are believed to have lower refractive index compared to similar materials without Al, such as GaN and InGaN. So, the general trend is to keep Al away from the waveguide core as much as possible. Nevertheless, the present inventors have recognized that the use of Al and InGaN in the waveguide layers of a semiconductor laser diode can be advantageous because the Al-containing layers provide strain compensation for InGaN layers, but do not hinder the high refractive index provided by the InGaN layers. This enhances optical confinement and optical gain while keeping high structure crystalline quality.

BRIEF SUMMARY

According to the concepts of the present disclosure, laser diode waveguide configurations are contemplated where the use of Al in the waveguide layers of the laser is presented in the form of InGaN/Al(In)GaN waveguiding superstructure comprising one or more optical confining wells (InGaN) and one or more corresponding strain compensating barriers (Al(In)GaN). The composition of the optical confining wells is chosen such that they provide strong optical confinement, even in the presence of the Al(In)GaN strain compensating barriers, but do not absorb lasing emission. The composition of the strain compensating barriers is chosen such that the Al(In)GaN exhibits tensile strain that compensates for the compressive strain of InGaN optical confinement wells but does not hinder the optical confinement.

In accordance with one embodiment of the present disclosure, a laser diode is provided comprising a semi-polar GaN substrate, an active region, a waveguiding region, and upper and lower cladding regions. The waveguiding region comprises at least one waveguiding superstructure, which comprises one or more $In_yGa_{1-y}N$ optical confining wells of well thickness a and one or more intervening $Al_xIn_zGa_{1-x-z}N$ strain compensating barriers of barrier layer thickness b defining a strain compensated structure, where x, y and z approximate the relations $0.02 \leq x \leq 0.40$, $0.05 \leq y \leq 0.35$, and $0 \leq z \leq 0.10$. The intervening strain compensating barriers comprise sufficient Al to compensate for strain introduced by the optical confining wells. Where a plurality of optical confining wells are employed, the In concentration and thicknesses in the wells do not need to be the same in each well. Similarly, where a plurality of barrier layers are employed, the In and Al concentrations and thicknesses of the barriers do not need to be the same in each barrier layer.

In accordance with another embodiment of the present disclosure, x, y and z approximate the relations $0.02 \leq x \leq 0.40$, $0.15 \leq y \leq 0.35$, and $0 < z \leq 0.10$, and the intervening strain compensating barriers comprise sufficient Al to compensate for a majority of strain introduced by the optical confining wells.

In accordance with yet another embodiment of the present disclosure, the optical confining wells comprise quantum wells and the strain compensating barriers comprise quantum well barrier layers.

BRIEF DESCRIPTION OF THE SEVERAL VIEWS OF THE DRAWINGS

The following detailed description of specific embodiments of the present disclosure can be best understood when read in conjunction with the following drawings, where like structure is indicated with like reference numerals and in which.

DETAILED DESCRIPTION

Figure 1:
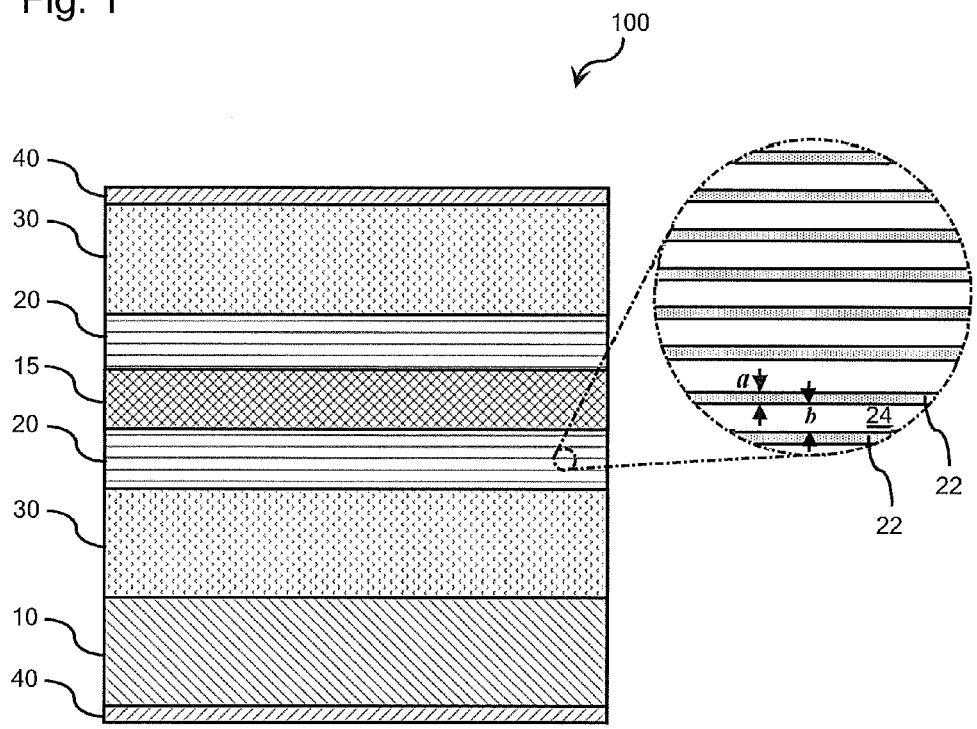
FIG. 1 is a schematic illustration of simplified laser diode structure including a waveguiding regions according to one embodiment of the present disclosure.

The laser diode 100 illustrated in FIG. 1 is generally representative of laser diodes according to one embodiment of the present disclosure and comprises a semi-polar GaN substrate 10, an active region 15, a waveguiding region comprising respective upper (p-side) and lower (n-side) waveguiding superstructures 20, upper and lower cladding regions 30, and upper and lower contact layers 40. The semi-polar GaN substrate 10 is cut along a semi-polar crystal growth plane—a growth plane the present inventors have recognized as advantageous because of potentially high optical gain and improved indium composition uniformity in InGaN quantum wells grown over the substrate. The present inventors have also recognized particular challenges associated with the use of a semi-polar growth plane in laser diode structures. Specifically, laser diode structures on semi-polar growth planes are often highly susceptible to crystal lattice misfit defect formation. The present disclosure addresses this design issue by utilizing a waveguiding region with one or more strain balanced waveguiding superstructures 20 in the laser diode structure. The concepts of the present invention may be practiced without the upper (p-side) waveguiding superstructure 20 and in many cases, it is contemplated that the strain balanced optical waveguiding superstructures described herein will only be employed in the lower waveguiding superstructure 20, as it will not typically be necessary to use a strain balanced superstructure above the active region 15.

FIG. 1 presents a schematic illustration of the general configuration of one particular laser diode 100 incorporating waveguiding superstructures according to the present disclosure. A variety of alternative laser configurations incorporating the waveguiding superstructures of the present disclosure are contemplated. For example, the present disclosure contemplates the use of a variety of alternative configurations for the active region 15, the cladding regions 30, and the contact layers 40. It is contemplated that the cladding layers 30 of the laser diode structure may comprise GaN, AlGaN, AlInGaN, or some combination thereof, and that the material composition of the two cladding layers may be different and vary across the cladding layer. Similarly, the active region 15 may take a variety of forms; for example, it may comprise an active multi-quantum well (MQW).

In addition, it is noted that laser configurations according to the present disclosure will typically incorporate additional layers not illustrated in FIG. 1, including for example, buffer layers, electron/hole blocking layers, etc. The respective active, waveguiding, and upper and lower cladding regions are formed as a multi-layered laser diode 100 over the semi-polar crystal growth plane of the semi-polar GaN substrate 10 such that the upper and lower waveguiding superstructure 20 of the waveguiding region guide the stimulated emission of photons from the active region 15, and the cladding regions 30 promote propagation of the emitted photons in the superstructures 20 of the waveguiding region.

Regardless of its particular configuration, the active region 15 will be configured for electrically or optically pumped stimulated emission of photons at a lasing wavelength $\lambda_C$. The waveguiding superstructures 20 are designed to define an absorption edge wavelength $\lambda_W$ that is less than the lasing wavelength $\lambda_C$ and preferably approximates the relation 10 nm$\leq(\lambda_C-\lambda_W)\leq$60 nm. In some embodiments, for example where the target strain compensation is substantially below 100%, the wavelength separation may exceed 60 nm. In other embodiments, the suitable wavelength separation range will be more narrow and the absorption edge wavelength $\lambda_W$ will approximate the relation 10 nm$\leq(\lambda_C-\lambda_W)\leq$20 nm. In any case, the waveguiding superstructures 20 will have a bandgap that is relatively close to the lasing photon energy but will not absorb lasing light.

It is contemplated that the waveguiding superstructures 20 can be periodic or aperiodic, i.e., the respective thicknesses of the optical confining wells 22 and the strain compensating barriers can be consistent or can vary across the superstructure 20. It is also contemplated that the waveguiding superstructures 20 may be configured as passive MQW waveguide layers. In which case, the optical confining wells 22 would comprise nanometer scale quantum wells and the strain compensating barriers 24 would comprise quantum well barrier layers. In one example, where the waveguiding superstructures 20 are configured as passive MQW waveguide layers, for a green laser diode with an emission wavelength of 530 nm, the passive MQW waveguide layers are configured to have an emission wavelength of approximately 510 nm to ensure that the absorption edge of the passive QW is close enough to lasing wavelength, i.e., a difference of about 20-60 nm. In many embodiments, it will be preferable to ensure that this wavelength difference is not less than 10 nm, to avoid suppression of optical gain by the passive MQW waveguide layers. Where the lasing wavelength $\lambda_C$ is between approximately 500 nm and approximately 540 nm, it is contemplated that the absorption edge wavelength $\lambda_W$ can be between approximately 430 nm and approximately 530 nm.

It is contemplated that waveguiding superstructures 20 according to the present disclosure will comprise a plurality of $In_yGa_{1-y}N$ optical confining wells 22 and intervening $Al_xIn_zGa_{1-x-z}N$ strain compensating barriers 24 defining a strain compensated structure, where x, and z approximate the relations $0.02\leq x\leq0.40$ and $0\leq z\leq0.10$. The value of y in the general case approximates the relation $0.05\leq y\leq0.35$, but for structures with strain compensation close to 100%, i.e. when Al concentration x in strain compensating barriers is relatively high, it is preferred to approximate the relation $0.15\leq y\leq0.35$ in order to maintain sufficiently high average refractive index. In particular embodiments, x approximates the relation $0.05\leq x\leq0.20$ and z approximates the relation $0<z\leq0.10$. It is also contemplated that In molar concentration may be non-constant within one or more optical confining wells. In this case, for each optical confining well, y refers to an average In molar concentration in such optical confining well. It is also contemplated that In molar concentration and Al molar concentration may be non-constant within one or more strain compensating barriers. In this case, for each strain compensating barrier, x refers to an average Al molar concentration and z refers to average In concentration in such strain compensating barrier. It is also contemplated that, in the waveguiding superstructure, the optical confining wells may differ in In molar concentration y, while the strain compensating barriers may differ in Al molar concentration x and In molar concentration y.

The present inventors have recognized that, unlike InGaN, the refractive index of Al(In)GaN reduces nearly linearly with Al concentration. This is because the absorption edge of Al(In)GaN in the above-noted compositional range is far away from the lasing photon energy. At the same time, the refractive index of InGaN in the specified range increases superlinearly with In concentration, because InGaN has lower bandgap that is closer to the lasing photon energy. In addition, tensile strain in Al(In)GaN increases linearly with Al concentration while compressive strain of InGaN well increases linearly as well with In content. Accordingly, the intervening Al(In)GaN strain compensating barriers 24 can be readily designed to comprise sufficient Al to compensate for strain introduced by the optical confining wells 22, thus suppressing misfit dislocation formation, but yet not strongly reduce average index of refraction which remains higher than refractive index of GaN thanks to the optical confinement wells. In case of non-zero In concentration in the Al(In)GaN strain compensating barriers 24, the combination of Al and In concentration should be chosen to provide tensile strain.

For example, for green laser emission, i.e., at 530 nm, the reduction of refractive index of Al(In)GaN with Al concentration is small. So while the Al(In)GaN strain compensating barriers 24 provide strain compensation, they do not strongly reduce the average refractive index of the waveguide core formed by the active region 15 and the waveguiding superstructures 20. The present inventors have found this approach to be counterintuitive because typically one would expect that the GaN/Al(In)GaN structure would have a lower refractive index than n-type GaN. In fact, although tensile strained $Al_xIn_zGa_{1-x-z}N$ has a lower refractive index than the GaN substrate 10 and the upper and lower cladding layers 30, the present inventors have recognized that, when the InGaN optical confinement well absorption edge is close enough to the lasing wavelength, the average refractive index of the waveguiding superstructures 20 is significantly higher than the GaN substrate 10 and the upper and lower cladding layers 30.

It is noted that in some embodiments of the present disclosure, the major relaxation mechanism will facilitate relaxation along the c axis. However, AlN/GaN lattice mismatch in the c-axis is 3.9%, which is higher than in the a or m axis (2.4%). Accordingly, strain compensation in the c-direction will be efficient for embodiments of the present disclosure. As a result, the use of waveguiding superstructures incorporating the Al(In)GaN strain compensating barriers according to the present disclosure will allow the growth of a waveguiding region that provides a large total refractive index contrast and compensates for compressive strain, partially or fully, in at least the projected c-direction. For example, in order to completely compensate for strain in the direction toward the c-axis of a 2.5 nm thick InGaN optical confining well with an In concentration of 25%, one can use a 17 nm AlGaN barrier layer with an Al concentration of approximately 10%. Alternatively, lower Al concentrations in the barrier layer would need to be accompanied by larger thicknesses.

In many embodiments, it will not be difficult to ensure that the waveguiding superstructures according to the present disclosure are greater than approximately 70 nm in thickness. In many embodiments, preferred well thicknesses a will be between approximately 2 nm and approximately 5 nm, and should not exceed approximately 60 nm. The barrier layer thickness is limited by the desired waveguide core thickness because excessive core thicknesses can lead to reduced optical confinement. Typical waveguide core thicknesses are approximately 70-300 nm above and below the active region of the core. Accordingly, in some embodiments of the present disclosure, the total thickness of all the strain compensating barriers in the waveguiding superstructures should not exceed 300 nm.

In one embodiment of the present disclosure, the percentage of strain compensation can be characterized by the percentage $\theta$, where $\theta > 0$ and $\theta = 1$ represents complete strain compensation, which is typically preferred. The respective thicknesses a, b of the optical confining wells 22 and the intervening strain compensating barriers 24 satisfy the relation:

$$(0.1y)\eta \approx \theta(0.039x + 0.1z)(1-\eta)$$

where y is averaged over all optical confining wells, x and z are averaged over all strain compensating barriers, $\eta$ is the $In_yGa_{1-y}N$ confining well duty cycle in the waveguiding superstructure 20, and $$\frac{a}{b} = \frac{\eta}{1-\eta}.$$

Figure 2:
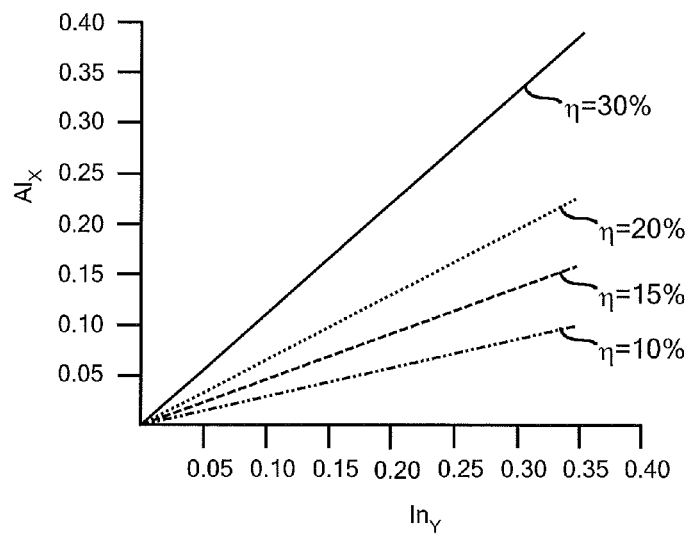
FIG. 2 is a graphic illustration of the relationship between Al and In concentrations in the barriers and wells, respectively, of waveguiding regions according to particular embodiments of the present disclosure.

It is contemplated that the $Al_xIn_zGa_{1-x-z}N$ strain compensating barriers can be readily configured to provide tensile strain sufficient to compensate for a majority of the compressive strain provided by the $In_yGa_{1-y}N$ optical confining wells. FIG. 2 illustrates the relationship between Al and In concentrations for various InGaN duty cycles of waveguiding regions according to particular embodiments of the present disclosure. It is contemplated that suitable duty cycles will range from approximately 5% to approximately 50%. In the case of an aperiodic structure, the strain compensation coefficient $\theta$ can be calculated using the respective total thicknesses a, b of the optical confining wells 22 and the intervening strain compensating barriers 24.

To achieve a significantly superlinear increase in the refractive index of InGaN with In concentration y, it is preferred to use sufficiently high In concentration in the InGaN optical confinement wells. It is contemplated that in order to obtain a waveguiding superstructure with a desired strain compensation coefficient $\theta$ and an average refractive index that is significantly higher than the refractive index of GaN substrate, the In concentration y in the optical confining wells is preferred to approximate $0.15\theta \leq y \leq 0.35$. By doing so, those practicing the concepts of the present disclosure will find it convenient to use the Al concentration x needed to achieve the desired strain compensation coefficient $\theta$, while maintaining the absorption edge of the optical confining wells close enough to the lasing wavelength to obtain a sufficiently high average refractive index.

In the embodiment illustrated in FIG. 1, the waveguiding region of the laser diode 100 comprises at least one waveguiding superstructure 20 on each side of the active region 15. It is contemplated, however, that laser diode structures according to the present disclosure may merely comprise a waveguiding superstructure 20 only on the n-side of the laser diode structure, while the p-side waveguide may comprise a conventional InGaN or GaN waveguide layer, or an alternative yet-to-be developed waveguide layer. Preferably, the p-side waveguide layer will also be tailored to have a thickness and In concentration small enough to avoid relaxation. Thus, the waveguide core composed of the active region and waveguide layers may be asymmetric, shifting the optical mode to the n-side. A benefit of this asymmetrical configuration is that there would be less mode penetration to the p-type material which in turn would reduce optical loss.

Considering embodiments where the waveguiding region of the laser diode 100 comprises at least one waveguiding superstructure 20 on each side of the active region 15, the waveguiding region will typically comprise p-doped and n-doped waveguiding superstructures 20 disposed on opposite sides of the active region 15 and the cladding region will typically comprise p-doped and n-doped layers 30 disposed on opposite sides of the active region 15. In which case, the active region 15 can be said to be disposed between a p-doped side of the laser diode and an n-doped side of the laser diode 100. The intervening strain compensating barriers 24 between the optical confining wells 22 on the n-doped side of the laser diode will be n-doped and the intervening strain compensating barriers 24 between optical confining wells 22 on the p-doped side of the laser diode will be p-doped. It is noteworthy that the aforementioned conditions of the respective layers on the n-doped and p-doped sides of the laser diode relate primarily to embodiments where a waveguiding superstructure is provided on each side of the active region and that many embodiments of the present disclosure do not require the strain-balanced waveguiding superstructures on both sides of the active region.

It is contemplated that laser diodes according to the present disclosure may comprises one or more additional optical confinement layers in the form of a bulk InGaN layer or an InGaN/GaN superlattice configured to improve optical confinement at the lasing wavelength $\lambda_C$. The waveguiding superstructures 20 can be sandwiched between the active region 15 and the additional confinement layers, for example a bulk InGaN layer or an InGaN/GaN superlattice. The respective thicknesses of the bulk InGaN layer or an InGaN/GaN superlattice should be small enough to prevent strain-induced relaxation in the laser diode. As is noted above, it may also be preferable to provide the laser diode 100 with an electron blocking layer above the active region 15. The electron blocking layer may be in the active region or interposed between the active region and the waveguiding layer which may comprise the waveguiding superstructure. For example, and not by way of limitation, the electron blocking layer can configured according to the teachings of US 2010/0150193 A1. The laser diode 100 may also comprise a hole blocking layer between the active region 15 and the n-side waveguiding layer which may comprise the waveguiding superstructure 20. These electron and hole blocking layers would preferably comprise AlGaN or AlInGaN with a bandgap wider than the bandgap of the barriers between the quantum wells in active region. Since the electron and hole blocking layers would comprise Al, they would also contribute to strain compensation. It may be preferable to interpose the electron blocking layer between the active region and all of the p-side InGaN layers, while the hole blocking layer is interposed between the active region and all of the n-side InGaN layers.

For the purpose of illustration and not limitation, a number of working examples according to the concepts of the present disclosure have been contemplated:

Example 1

A laser diode structure comprising the following layers (from bottom to top):
n-GaN buffer layer and cladding layer;
8-12 periods of passive multiple quantum wells, where 2-5 nm passive QWs are separated by 10 nm AlInGaN or AlGaN barriers (for AlGaN, the Al concentration should be 5%-15%), the passive quantum wells are configured to have an emission wavelength 10-40 nm shorter than the lasing wavelength;
2 or 3 periods of InGaN active quantum wells configured to provide optical gain in green spectral range (500-540 nm);
AlInGaN electron blocking layer; and
600-1200 nm thick p-side GaN cladding layer.

Example 2

Similar to Example 1, except an AlInGaN cladding layer is used at least in the n-side cladding layer. This AlInGaN layer lattice matched in one in-plane direction (typically toward c-axis) and has sufficiently low strain in another direction to avoid relaxation. The p-side cladding layer may comprise AlInGaN or AlGaN layer. Each cladding layer may also be made of combination of AlGaN, GaN, InGaN or AlInGaN layers. The structure can also comprise, in addition to strain compensated passive QWs, a bulk InGaN layer or InGaN/GaN superlattice in the waveguide core, to further improve optical confinement. The presence of the strain compensated passive QWs enhances optical confinement, such that high In concentration or large thickness of this bulk layers or superlattices is no longer needed and they can be thin enough to avoid relaxation. Also, due to high refractive index of the passive quantum wells, it is preferred in some designs to position the passive quantum wells between the active region and this additional layer.

Example 3

A laser diode structure comprising two passive wells with 5 nm n-AlInGaN barrier below them and 17 nm n-AlInGaN barrier above them. The two passive QWs are separated by 17 nm thick AlInGaN barrier layer. Such structure is placed between the hole blocking layer and the n-InGaN/GaN superlattice with average In concentration 3%-6%. The thickness of the n-superlattice is 114 nm, and it is below the relaxation limit for (20-21) substrate orientation. The n-AlInGaN cladding layer, or the combination of AlInGaN/GaN layers, is placed below the n-InGaN/GaN superlattice layer. The structure also comprises p-InGaN/GaN superlattice with thickness 90 nm. A p-type GaN, AlGaN, AlInGaN, or combination cladding layer may be grown similarly to examples 1 and 2. The structure should also comprise an electron blocking layer between the active region and the cladding layer.

Example 4

A laser diode structure similar to the previous examples, except there are more than 2 passive quantum wells. In this case the passive quantum wells are separated by AlInGaN barriers. The n-type InGaN superlattice layer may be thinner because more optical confinement is provided by the passive QWs.

Example 5

A laser diode structure comprise one passive QW. This design is similar to Example 3, except there is just one passive quantum well and a slightly thicker InGaN superlattice (120 nm).

It is noted that recitations herein of a component of the present disclosure being "configured" to embody a particular property, or function in a particular manner, are structural recitations, as opposed to recitations of intended use. More specifically, the references herein to the manner in which a component is "configured" denotes an existing physical condition of the component and, as such, is to be taken as a definite recitation of the structural characteristics of the component.

It is noted that terms like "preferably," "commonly," and "typically," when utilized herein, are not utilized to limit the scope of the claimed invention or to imply that certain features are critical, essential, or even important to the structure or function of the claimed invention. Rather, these terms are merely intended to identify particular aspects of an embodiment of the present disclosure or to emphasize alternative or additional features that may or may not be utilized in a particular embodiment of the present disclosure.

For the purposes of describing and defining the present invention, it is noted that the term "approximately" is utilized herein to represent the inherent degree of uncertainty that may be attributed to any quantitative comparison, value, measurement, or other representation. The term "substantially" is also utilized herein to represent the degree by which a quantitative representation may vary from a stated reference without resulting in a change in the basic function of the subject matter at issue.

Having described the subject matter of the present disclosure in detail and by reference to specific embodiments thereof, it will be apparent that modifications and variations are possible without departing from the scope of the invention defined in the appended claims. More specifically, although some aspects of the present disclosure are identified herein as preferred or particularly advantageous, it is contemplated that the present disclosure is not necessarily limited to these aspects. For example, although the present invention is described primarily with reference to waveguiding superstructures 20, it is contemplated that the waveguiding superstructures 20 may be configured as passive MQW waveguide layers. In which case, the optical confining wells 22 would comprise nanometer scale quantum wells and the strain compensating barriers 24 would comprise quantum well barrier layers. Typically, the quantum well layers in a passive MWQ structure will be less than 10 nm thick.

It is noted that one or more of the following claims utilize the term "wherein" as a transitional phrase. For the purposes of defining the present invention, it is noted that this term is introduced in the claims as an open-ended transitional phrase that is used to introduce a recitation of a series of characteristics of the structure and should be interpreted in like manner as the more commonly used open-ended preamble term "comprising."

What is claimed is:

1. A laser diode comprising a semi-polar GaN substrate, an active region, a waveguiding region, and upper and lower cladding regions, wherein:
   the semi-polar GaN substrate is cut along a semi-polar crystal growth plane;
   the active region is configured for electrically-pumped stimulated emission of photons at a lasing wavelength $\lambda_C$;
   the waveguiding region comprises at least one waveguiding superstructure;
   the waveguiding superstructure comprises a plurality of $In_yGa_{1-y}N$ optical confining wells of well thickness a and a plurality of intervening $Al_xIn_zGa_{1-x-z}N$ strain compensating barriers of barrier layer thickness b defining a strain compensated structure, where x, y and z approximate the relations $0.02 \leq x \leq 0.40$, $0.05 \leq y \leq 0.35$, and $0 \leq z \leq 0.10$;
   the intervening strain compensating barriers comprise sufficient Al to compensate for strain introduced by the optical confining wells; and
   the respective active, waveguiding, and upper and lower cladding regions are formed as a multi-layered laser diode over the semi-polar crystal growth plane of the semi-polar GaN substrate such that the waveguiding region guides the stimulated emission of photons from the active region, and the cladding region promotes propagation of the emitted photons in the waveguiding region.

2. A laser diode as claimed in claim 1 wherein:
   the intervening strain compensating barriers comprise sufficient Al to compensate for strain introduced by the optical confining wells to a strain compensation percentage $\theta$, where $\theta > 0$ and $\theta = 1$ represents complete strain compensation;
   the respective thicknesses a, b of the optical confining wells and the intervening strain compensating barriers satisfy the relation $$(0.1y)\eta \approx \theta(0.039x+0.1z)(1-\eta)$$

where x, y and z are averaged over the waveguiding superstructure, $\eta$ is the periodic or aperiodic $In_yGa_{1-y}N$ confining well duty cycle or average duty cycle in the waveguiding superstructure, and $\frac{a}{b} = \frac{\eta}{1-\eta}$.

3. A laser diode as claimed in claim 1 wherein the waveguiding superstructure is characterized by an absorption edge wavelength $\lambda_W$ that approximates the relation $10\ nm \leq (\lambda_C - \lambda_W) \leq 60\ nm$.

4. A laser diode as claimed in claim 1 wherein:
   the waveguiding superstructure is configured as a passive MQW waveguide layer;
   the optical confining wells comprise quantum wells; and
   the strain compensating barriers comprise quantum well barrier layers.

5. A laser diode as claimed in claim 4 wherein the waveguiding superstructure is characterized by an absorption edge wavelength $\lambda_W$ that approximates the relation $10\ nm \leq (\lambda_C - \lambda_W) \leq 40\ nm$.

6. A laser diode as claimed in claim 1 wherein $In_yGa_{1-y}N$ optical confining wells provide compressive strain and the $Al_xIn_zGa_{1-x-z}N$ strain compensating barriers provide tensile strain sufficient to compensate for a majority of the compressive strain provided by the $In_yGa_{1-y}N$ optical confining wells.

7. A laser diode as claimed in claim 6 wherein the average refractive index of the waveguiding superstructure is higher than the GaN substrate and the upper and lower cladding layers.

8. A laser diode as claimed in claim 1 wherein the waveguiding superstructure comprises a plurality of $Al_xIn_zGa_{1-x-z}N$ strain compensating barriers which collectively define a thickness less than approximately 300 nm.

9. A laser diode as claimed in claim 1 wherein the well thickness a is between approximately 2 nm and approximately 5 nm.

10. A laser diode as claimed in claim 1 wherein the well thickness a does not exceed approximately 60 nm.

11. A laser diode as claimed in claim 1 wherein x approximates the relation $0.05 \leq x \leq 0.20$ for at least one strain compensating barrier.

12. A laser diode as claimed in claim 1 wherein z approximates the relation $0 < z \leq 0.10$ for at least one strain compensating barrier.

13. A laser diode as claimed in claim 1 wherein:
    the intervening strain compensating barriers comprise sufficient Al to compensate for substantially all strain introduced by the optical confining wells, such that the strain compensation percentage $\theta$ is above approximately 0.9; and
    y approximates the relation $0.15 \leq y \leq 0.35$ for at least one optical confining well.

14. A laser diode as claimed in claim 1 wherein y is in a range that is partially defined by the strain compensation percentage $\theta$ and approximates the relation $0.15\theta \leq y \leq 0.35$ for at least one optical confining well.

15. A laser diode as claimed in claim 1 wherein the intervening strain compensating barriers comprise sufficient Al to compensate for a majority of strain introduced by the optical confining wells, such that the strain compensation percentage $\theta$ is above approximately 0.5.

16. A laser diode as claimed in claim 1 wherein the waveguiding region of the laser diode comprises at least one waveguiding superstructure on each side of the active region in the multi-layered laser diode such that each waveguiding superstructure guides the stimulated emission of photons from the active region.

17. A laser diode as claimed in claim 1 wherein the lasing wavelength $\lambda_C$ is between approximately 500 nm and approximately 540 nm and the absorption edge wavelength $\lambda_W$ is between approximately 430 nm and approximately 530 nm.

18. A laser diode as claimed in claim 1 wherein the absorption edge wavelength $\lambda_W$ approximates the relation $10\ nm \leq (\lambda_C - \lambda_W) \leq 20\ nm$.

19. A laser diode as claimed in claim 1 wherein:
    the laser diode further comprises one or more additional confinement layers in the form of a bulk InGaN layer or an InGaN/GaN superlattice configured to improve optical confinement at the lasing wavelength $\lambda_C$; and
    the respective thicknesses of the bulk InGaN layer or an InGaN/GaN superlattice are small enough to prevent strain-induced relaxation in the laser diode.

20. A laser diode as claimed in claim 19 wherein the waveguiding superstructure is sandwiched between the active region and the additional confinement layers.

21. A laser diode as claimed in claim 1 wherein the laser diode comprises an asymmetric waveguide core comprising the active region and the waveguiding superstructure configured to shift an optical mode of the laser to an n-side of the laser diode.

22. A laser diode comprising a semi-polar GaN substrate, an active region, a waveguiding region, and upper and lower cladding regions, wherein:
- the semi-polar GaN substrate is cut along a semi-polar crystal growth plane;
- the active region is configured for electrically-pumped stimulated emission of photons at a lasing wavelength $\lambda_C$;
- the waveguiding region comprises at least one waveguiding superstructure;
- the waveguiding superstructure comprises one or more $In_yGa_{1-y}N$ optical confining wells of well thickness a and one or more intervening $Al_xIn_zGa_{1-x-z}N$ strain compensating barriers of barrier layer thickness b defining a strain compensated structure, where x, y and z approximate the relations $0.02 \leq x \leq 0.40$, $0.05 \leq y \leq 0.35$, and $0 \leq z \leq 0.10$;
- the intervening strain compensating barriers comprise sufficient Al to compensate for a majority of strain introduced by the optical confining wells to a strain compensation percentage θ, where θ>0 and θ=1 represents complete strain compensation;
- the respective thicknesses a, b of the optical confining wells and the intervening strain compensating barriers satisfy the relation $(0.1y)\eta \approx \theta(0.039x+0.1z)(1-\eta)$ where x, y and z are averaged over the waveguiding superstructure, η is the periodic or aperiodic $In_yGa_{1-y}N$ confining well duty cycle or average duty cycle in the waveguiding superstructure, and $$\frac{a}{b} = \frac{\eta}{1-\eta};$$

and
- the respective active, waveguiding, and upper and lower cladding regions are formed as a multi-layered laser diode over the semi-polar crystal growth plane of the semi-polar GaN substrate such that the waveguiding region guides the stimulated emission of photons from the active region, and the cladding region promotes propagation of the emitted photons in the waveguiding region.

23. A laser diode comprising a semi-polar GaN substrate, an active region, a waveguiding region, and upper and lower cladding regions, wherein:
- the semi-polar GaN substrate is cut along a semi-polar crystal growth plane;
- the active region is configured for electrically-pumped stimulated emission of photons at a lasing wavelength $\lambda_C$;
- the waveguiding region comprises at least one waveguiding superstructure and is characterized by an absorption edge wavelength $\lambda_W$ that approximates the relation $10\,nm \leq (\lambda_C - \lambda_W) \leq 20\,nm$;
- the waveguiding superstructure is configured as a passive MQW waveguide layer and comprises a plurality of $In_yGa_{1-y}N$ optical confining wells of well thickness a and intervening $Al_xIn_zGa_{1-x-z}N$ strain compensating barriers of barrier layer thickness b defining a strain compensated structure, where x, y and z approximate the relations $0.02 \leq x \leq 0.40$, $0.15 \leq y \leq 0.35$, and $0 < z \leq 0.10$;
- the optical confining wells comprise quantum wells;
- the strain compensating barriers comprise quantum well barrier layers;
- the intervening strain compensating barriers comprise sufficient Al to compensate for a majority of strain introduced by the optical confining wells to a strain compensation percentage θ, where θ>0 and θ=1 represents complete strain compensation;
- the respective thicknesses a, b of the optical confining wells and the intervening strain compensating barriers satisfy the relation $(0.1y)\eta \approx \theta(0.039x+0.1z)(1-\eta)$ where x, y and z are averaged over the waveguiding superstructure, η is the $In_yGa_{1-y}N$ confining well duty cycle in the waveguiding superstructure, and $$\frac{a}{b} = \frac{\eta}{1-\eta};$$

- the tensile strained $Al_xIn_zGa_{1-y-z}N$ has a lower refractive index than the GaN substrate and the upper and lower cladding layers;
- the average refractive index of the waveguiding superstructure is higher than the GaN substrate and the upper and lower cladding layers; and
- the respective active, waveguiding, and upper and lower cladding regions are formed as a multi-layered laser diode over the semi-polar crystal growth plane of the semi-polar GaN substrate such that the waveguiding region guides the stimulated emission of photons from the active region, and the cladding region promotes propagation of the emitted photons in the waveguiding region.

* * * * *